United States Patent [19]

Kasugai

[11] Patent Number: 4,982,328
[45] Date of Patent: Jan. 1, 1991

[54] METHOD AND SYSTEM FOR CORRECTING MAGNETIC RESONANCE IMAGES FOR ANIMATION DISPLAY

[75] Inventor: Takao Kasugai, Nishinasunomachi, Japan

[73] Assignee: Kabushiki Kaisha Toshiba, Kawasaki, Japan

[21] Appl. No.: 257,839

[22] Filed: Oct. 14, 1988

[30] Foreign Application Priority Data

Oct. 15, 1987 [JP] Japan .................. 62-260973

[51] Int. Cl.$^5$ .......................... G06F 15/42
[52] U.S. Cl. .................. 364/413.22; 324/309
[58] Field of Search ............ 364/413.22, 413.06; 324/309, 300; 128/653

[56] References Cited

U.S. PATENT DOCUMENTS

| | | | |
|---|---|---|---|
| 4,409,550 | 10/1983 | Fossel et al. | 324/309 X |
| 4,564,017 | 1/1986 | Glover | 324/300 X |
| 4,614,195 | 9/1986 | Bottomley et al. | 324/309 X |
| 4,663,591 | 5/1987 | Pele et al. | 324/309 |
| 4,682,109 | 7/1987 | Cuppen | 324/309 |
| 4,724,386 | 2/1988 | Haacke et al. | 324/309 |
| 4,769,760 | 9/1988 | Kroll et al. | 364/413.06 |
| 4,779,620 | 10/1988 | Zimmermann et al. | 324/309 X |

Primary Examiner—Jerry Smith
Assistant Examiner—Steven G. Kibby
Attorney, Agent, or Firm—Foley & Lardner, Schwartz, Jeffery, Schwaab, Mack, Blumenthal & Evans

[57] ABSTRACT

In an MRI (magnetic resonance imaging) apparatus, MR (magnetic resonance) images of a subject for animation-display are acquired in accordance with a predetermined timing. The timing is obtained by measuring a signal representing a biological phenomenon, for example, an electrocardiogram signal. The acquired MR images are corrected. An ROI (region of interest) for the MR images is set and standard MR image is designated among the acquired MR images. An average image value of the MR images in the ROI is calculated based on a difference in average image value between the designated standard MR image and other MR images in the ROI. The other MR images are corrected in accordance with the difference of the average image value.

6 Claims, 5 Drawing Sheets

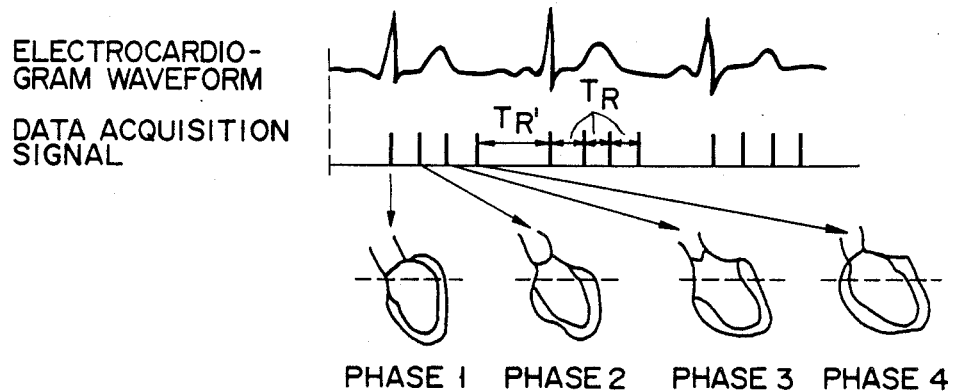
F I G. 1
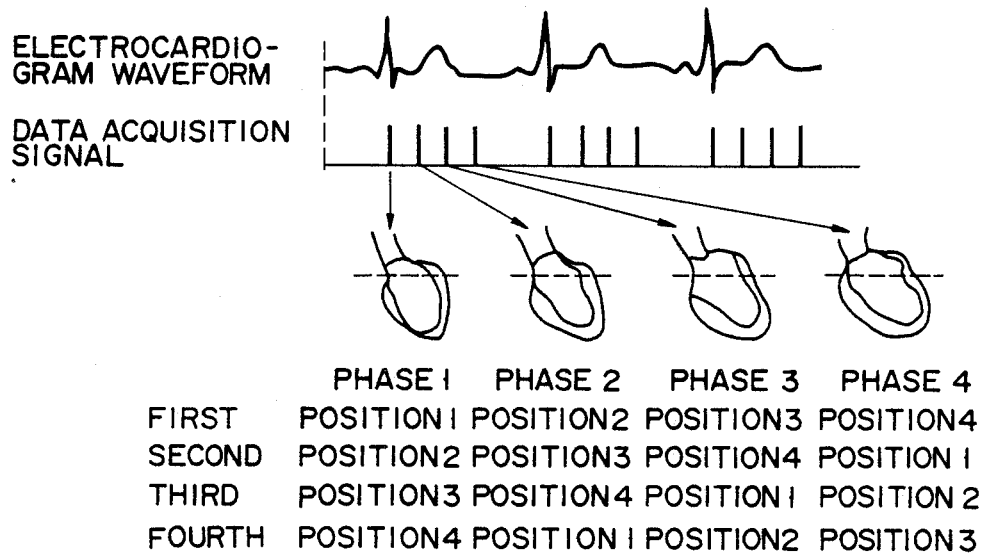
F I G. 2

METHOD AND SYSTEM FOR CORRECTING MAGNETIC RESONANCE IMAGES FOR ANIMATION DISPLAY

BACKGROUND OF THE INVENTION

1. Field of the Invention

The present invention relates to a method and system for correcting magnetic resonance images for animation display.

2. Description of the Related Art

A magnetic resonance imaging (MRI) system is of such a type that, by applying a uniform static magnetic field to a predetermined position of a subject and applying a radio frequency (RF) magnetic field by an RF coil in a direction to that static magnetic field, an MR phenomenon occurs at a predetermined slice of the subject and, after the application of the RF magnetic field has been completed, an MR signal which originates from the subject is detected by the RF coil. Upon the superimposition of a liner-gradient magnetic field onto the static magnetic field the MR signal is obtained which is Fourier-transformed to acquire projection data. A computed tomogram image corresponding to the slice is reconstituted by projection data.

In this type of MRI system, in synchronization with the heart rate of the subject an MR signal at each time phase is reconstituted for continuous display (animation display).

FIG. 1 shows the sequence for obtaining an MR image at each time phase which corresponds to a region of interest (ROI). In FIG. 1, TR represents a repetition time period and TR' initial repetition time period within one heart rate. Here the image value I of the MR image is given by:

$$I = A \cdot exp(-TE/T2)(1 - exp(-TR/T1))$$

where
- A: the density of protons;
- TE: the echo time;
- T1: the longitudinal relaxation time; and
- T2: the traverse relaxation time.

If, in this case, the initial repetition time period TR' is different from the other repetition time period TR, then a shift occurs at an image value I.

If an MR image is to be obtained with respect to each time phase corresponding to a different ROI, MR data on positions 1, 2, 3 and 4 are collected at a first scan; MR data on positions 2, 3, 4 and 1 at the second scan; MR data on positions 3, 4, 1 and 2 at the third scan and MR data on positions 4, 1, 2 and 3 at the fourth scan, respectively. Since, in this case, a multi-slice method is employed in changing the positions on the ROI of the subject, an image value varies in accordance with the time phase and hence display images are very difficult to view as an animation display.

A growing demand has been made for an MRI system which can readily display an MR image, in an animation fashion, which is obtained for each time phase in synchronization with the heart rate of a subject.

SUMMARY OF THE INVENTION

It is accordingly the object of the present invention to provide a method and system for correcting MR images so that the image for each time phase which is obtained in synchronization with the heart rate of a subject may readily be displayed in an animation fashion.

According to one aspect of the present invention, there is provided a method for correcting magnetic resonance images utilized for animation-display, the method comprising the steps of: acquiring the magnetic resonance images in accordance with a given timing; correcting the acquired magnetic resonance images by obtaining an agreement among average image values of the acquired magnetic resonance images in a region of interest; and displaying the corrected magnetic resonance images.

According to another aspect of the present invention, there is provided a system for correcting magnetic resonance images utilized for animation-display, the system comprising: acquiring mean for acquiring the magnetic resonance images in accordance with a given timing; correcting means for correcting the magnetic resonance images acquired by the acquiring means by obtaining an agreement among average image values of the acquired magnetic resonance images in a region of interest of a subject; and displaying means for displaying the magnetic resonance images corrected by the correcting means.

BRIEF DESCRIPTION OF THE DRAWINGS

FIG. 1 shows the sequence for obtaining MR images of multiple time phases corresponding to the same region of interest of a subject;

FIG. 2 shows a sequence for obtaining MR images of multiple time phases corresponding to a different region of interest of a subject;

DETAILED DESCRIPTION OF THE PREFERRED EMBODIMENTS

Figure 3:
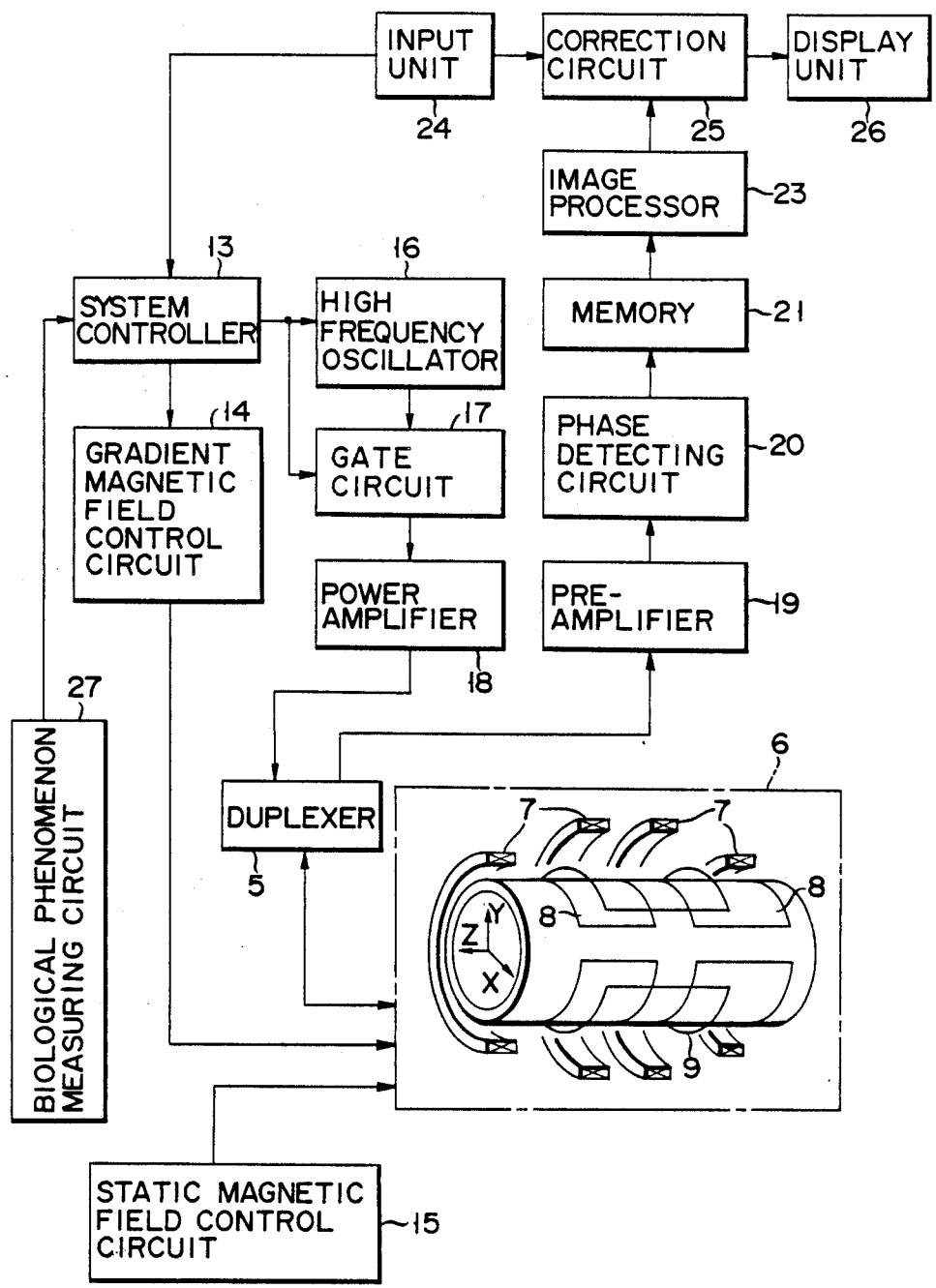
FIG. 3 is a block diagram showing an arrangement of a MRI system according to one embodiment of the present invention.

In FIG. 3, magnetic field generator 6 comprises static magnetic field coil 7 for generating a static magnetic field, gradient magnetic field coil 8 for generating a gradient magnetic field in the X, Y and Z directions in FIG. 3, and transmitting/receiving coil 9 for applying an RF pulse for exciting a spin at the atomic nuclei of an ROI of a subject and for receiving a corresponding MR signal generated within the subject. In this case the subject lies within magnetic field generator 6.

System controller 13 generates a timing signal for acquiring MR signals. Gradient magnetic field control circuit 14, high frequency oscillator 16 and gate circuit 17 are controlled by the timing signal of system controller 13. In this way it is possible to control gradient magnetic fields Gx, Gy and Gz as well as the generation sequence of an RF pulse.

Gradient magnetic field control circuit 14 is connected to gradient magnetic field coil 8 to control a current which is supplied to gradient magnetic field coil 8. Static magnetic field control circuit 15 is connected to static magnetic field coil 7 to control a current which is supplied to static magnetic field coil 7. High frequency oscillator 16 is connected to gate circuit 17 to generate a high frequency signal. Gate circuit 17 is connected to power amplifier 18 to cause a high frequency pulse signal by modulating the high frequency signal generated from high frequency oscillator 16 by the timing signal from system controller 13. Power amplifier 18 amplifies the high frequency pulse signal caused by gate circuit 17 and the amplified high frequency pulse signal is supplied via duplexer 5 to transmitting/receiving coil 9.

Preamplifier 19 is connected to phase detecting circuit 20 to amplify MR signals which are received via duplexer 5 from transmitting/receiving coil 9. Phase detecting circuit 20 is connected to memory 21 to detect the MR signals which have been amplified by preamplifier 19. Memory 21 is connected to image processor 23, and stores the MR signals which are input to image processor 23 to reconstitute the MR images.

The present system is operated in synchronization with the heart rate of the subject to acquire MR image data corresponding to each time phase of the subject. In this case, the synchronizing signal corresponding to the heart rate of the subject is acquired by biological phenomenon measuring circuit 27. The biological phenomenon measuring circuit 27 is composed of, for example, an electrocardiograph for detecting an electrocardiogram (ECG) signal of a subject within magnetic field generator 6. A signal of measuring circuit 27 is input to system controller 13.

The MR image data collection conditions, designation of a standard MR image and setting of ROI for the MR images are achieved by input unit 24 which is constituted by, for example, a keyboard. The MR data collection conditions are input to system controller 13 and the designation data of the standard MR image and the setting data of the ROI for the MR images are input to correction circuit 25.

Correction circuit 25 corrects a variation in image values among a plurality of MR images. The corrected MR image data of correction circuit 25 is input to display unit 26 where it is continuously displayed in an animation fashion.

Figure 4:
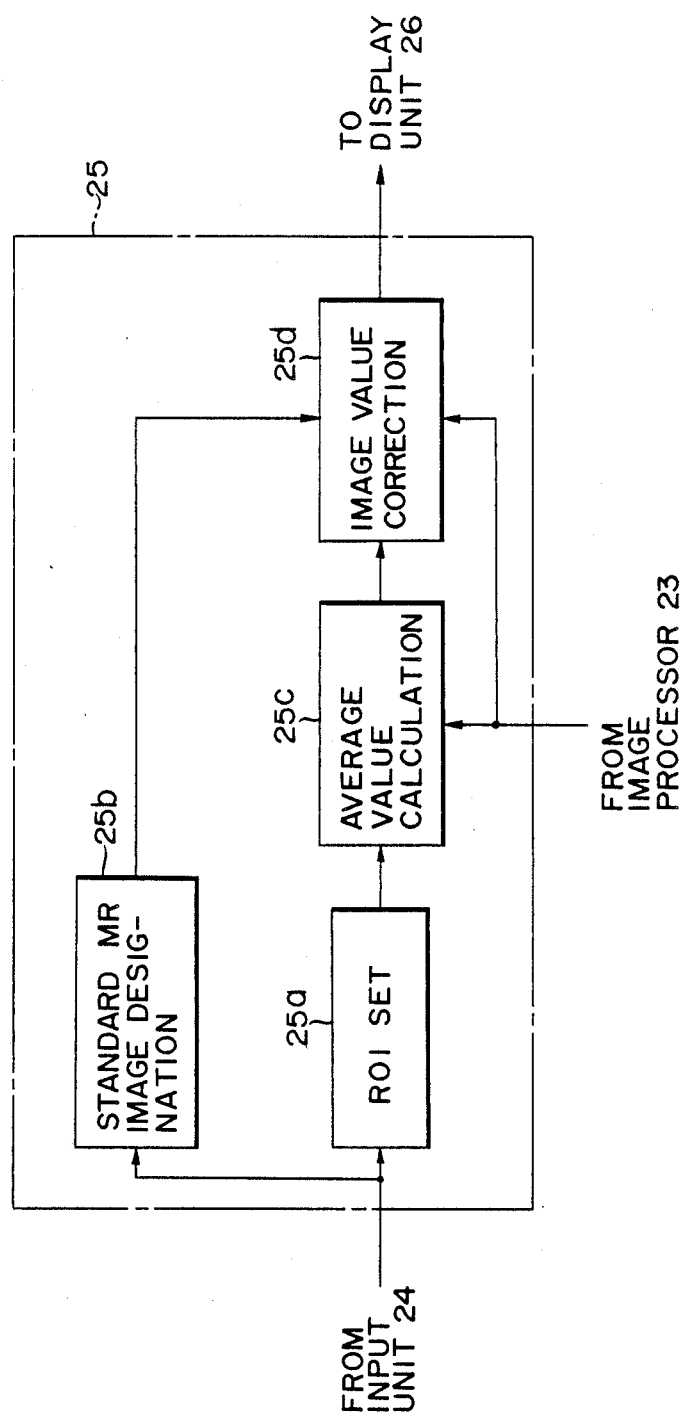
FIG. 4 is a block diagram showing the function of a correction circuit for the MRI system shown in FIG. 3.

Correction circuit 25 includes, as shown in FIG. 4, ROI setting block 25a, standard MR image designation block 25b, average value calculation block 25c and image value correction block 25d as functional blocks.

The operation of the present system thus arranged will be explained below.

Static magnetic field control circuit 15 supplies a current to static magnetic field coil 7 to generate a uniform static magnetic field in a z direction. In accordance with a predetermined pulse sequence a selective excitation is effected at a predetermined slice of the subject to generate an MR signal. The MR signal is supplied to duplexer 5 where it is detected. The detected MR signal is supplied via preamplifier 19 to phase detecting circuit 20 to perform spectral analysis. The analyzed MR image is supplied via memory 21 to image processor 23. In order to acquire the MR image for each time phase of the subject, the present system supplies the ECG signal of the subject which has been obtained by biological phenomenon measuring circuit 27 to system controller 13. In this way, the operation of the present system is carried out in a sequence as shown in FIGS. 1 and 2.

By above process, the present system reconstitutes a plurality of MR images for animation display.

Here the designation of the standard MR image for the time phase as well as the setting of ROI on the MR image is performed by the operator on input unit 24 and output of input unit 24 is input to correction circuit 25.

Figure 5:
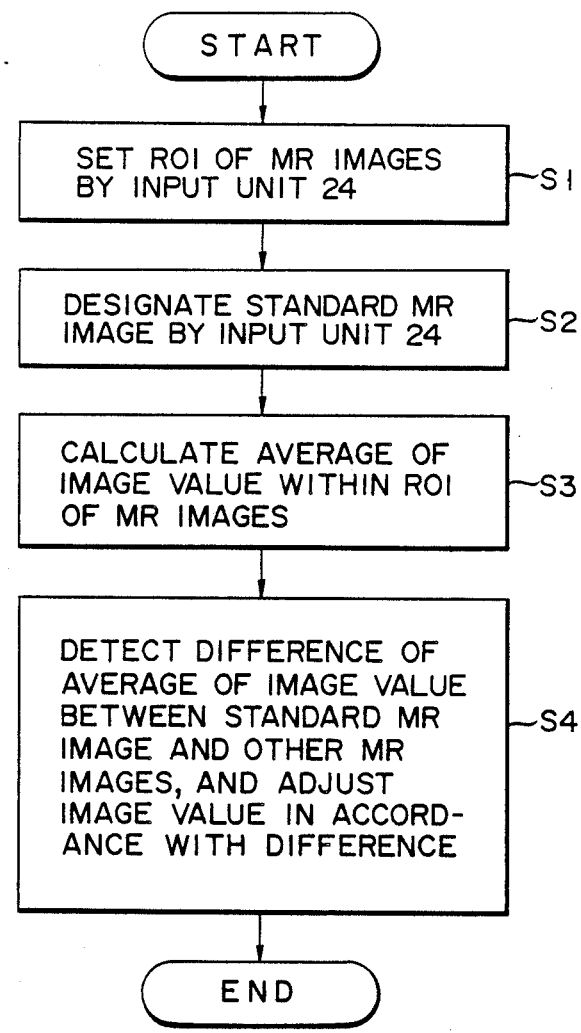
FIG. 5 is an operation flowchart for the correction circuit shown in FIG. 4.

Correction circuit 25 is operated in accordance with the flowchart of FIG. 5.

Figure 6:
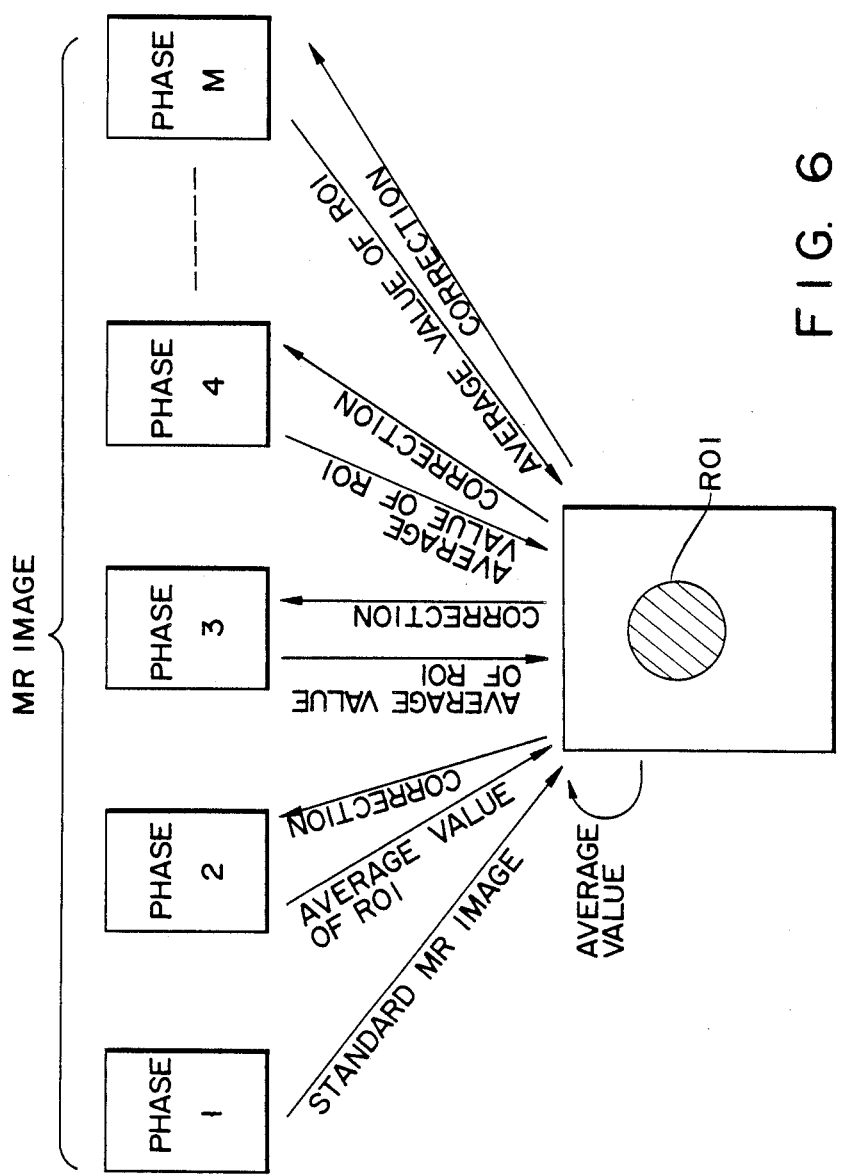
FIG. 6 is a view for explaining the process for correcting the image value of MR images at the correction circuit.

In step S1, the ROI of the MR image is set by input unit 24 and in step S2 the standard MR image is designated by input unit 24. An average of image values in the ROI of MR images (all the MR images for animation display) constituted by image processor 23 is calculated at step S3. At step S4, a difference in average value between the standard MR image and those images, other than the standard image, which are constituted by image processor 23 for animation display are evaluated in terms of the ROI. The image values are corrected by the difference to adjust the aforementioned other MR images in accordance with the standard MR image. That is, of those MR images 1 to M (M: a positive integer) as shown in FIG. 6, if the MR image of the time phase is used as the standard MR image, the MR images of the time phases 2 to M is corrected by comparing the standard MR image with the other MR images of the time phases 2 to M in terms of average value in the ROI of the subject. The corrected MR images and standard MR image are output to display unit 26.

In the present system thus arranged, the other MR images can be corrected in terms of average value for their time phases to provided an easy-to-view image display in a continuous and hence animation fashion. It is thus possible to provide an easy-to-view animation display on the present system applied to medical diagnosis for instance.

Although the present invention has been explained in conjunction with the embodiment, it should not be restricted to the aforementioned embodiment and can be changed or modified in a variety of ways without departing from the spirit and scope of the present invention.

What is claimed is:

1. A method for correcting magnetic resonance images utilized for animation-display, the method comprising the steps of:
   acquiring the magnetic resonance images in accordance with a given timing;
   correcting the acquired magnetic resonance images by obtaining an agreement with an average image value among the acquired magnetic resonance images in a region of interest; and
   displaying the corrected acquired magnetic resonance images.

2. A method according to claim 1, wherein the magnetic resonance images are acquired in synchronization with a heart rate of a subject.

3. A method for correcting magnetic resonance images utilized for animation-display, the method comprising the steps of:
   acquiring the magnetic resonance images in accordance with a given timing;
   correcting the acquired magnetic resonance images by obtaining agreement with an average image values among the acquired magnetic resonance images in regions of interest wherein the correcting step includes the steps of:
   setting the regions of interest of the acquired magnetic resonance images;
   selecting a standard magnetic resonance image among the acquired magnetic resonance images;

calculating the average image values of the magnetic resonance images in the set regions of interest;

detecting differences of the average image values between the standard magnetic resonance image and other magnetic resonance images; and adjusting image values of the other magnetic resonance images in accordance with the detected differences; an displaying the corrected acquired magnetic resonance images.

4. A system for correcting magnetic resonance images utilized for animation-display, the system comprising:

acquiring means for acquiring the magnetic resonance images in accordance with a given timing;

correcting means for correcting the magnetic resonance images acquired by the acquiring means by obtaining an agreement with an average image value among the acquired magnetic resonance images in a region of interest; and displaying means for displaying the magnetic resonance images corrected by the correcting means.

5. A system according to claim 4, wherein the magnetic resonance images are acquired in synchronization with a heart rate of a subject.

6. A system for correcting magnetic resonance images utilized for animation-display, the system comprising:

acquiring means for acquiring the magnetic resonance images in accordance with a given timing;

correcting means for correcting the acquired magnetic resonance images by obtaining an agreement of average image values among the acquired magnetic resonance images in regions of interest wherein the correcting means comprises:

region setting means for setting the regions of interest of the acquired magnetic resonance images;

standard image selecting means for designating selecting a standard magnetic resonance image among the acquired magnetic resonance images;

calculating means for calculating the average image values of the magnetic resonance images in the regions of interest set by the region setting means; and adjusting means for adjusting image values of other magnetic resonance images in accordance with differences of the average image values between the selected standard magnetic resonance image and the other magnetic resonance images; and displaying means for displaying the corrected acquired magnetic resonance images.

* * * * *